United States Patent
Oda

(10) Patent No.: US 9,732,413 B2
(45) Date of Patent: Aug. 15, 2017

(54) RUTHENIUM-ALLOY SPUTTERING TARGET

(75) Inventor: Kunihiro Oda, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 1910 days.

(21) Appl. No.: 11/916,860

(22) PCT Filed: May 16, 2006

(86) PCT No.: PCT/JP2006/309698
§ 371 (c)(1),
(2), (4) Date: Dec. 7, 2007

(87) PCT Pub. No.: WO2006/134743
PCT Pub. Date: Dec. 21, 2006

(65) Prior Publication Data
US 2009/0114535 A1     May 7, 2009

(30) Foreign Application Priority Data
Jun. 16, 2005   (JP) ................................ 2005-175878

(51) Int. Cl.
C23C 14/34 (2006.01)
B22F 3/10 (2006.01)
C22C 5/04 (2006.01)

(52) U.S. Cl.
CPC ............ C23C 14/3414 (2013.01); B22F 3/10 (2013.01); C22C 5/04 (2013.01)

(58) Field of Classification Search
CPC ............ H01J 37/3414; H01J 37/3426; C23C 14/3414; C22C 5/04; B22F 3/10
USPC ............ 204/192.13, 192.12, 298.13, 298.12; 420/462, 580
See application file for complete search history.

(56) References Cited

U.S. PATENT DOCUMENTS

| | | | |
|---|---|---|---|
| 5,470,527 A | 11/1995 | Yamanobe et al. | |
| 6,036,741 A | 3/2000 | Shindo et al. | |
| 6,165,607 A * | 12/2000 | Yamanobe et al. | 428/332 |
| 6,284,013 B1 | 9/2001 | Shindo et al. | |
| 6,589,311 B1 | 7/2003 | Han et al. | |
| 7,578,965 B2 | 8/2009 | Shindo et al. | |
| 7,871,564 B2 | 1/2011 | Kanou et al. | |
| 2004/0144204 A1 | 7/2004 | Hisano | |
| 2007/0175753 A1 | 8/2007 | Hisano | |
| 2007/0240992 A1 | 10/2007 | Shindo et al. | |

FOREIGN PATENT DOCUMENTS

| | | | |
|---|---|---|---|
| EP | 1 066 899 A2 * | 1/2001 | |
| JP | 2000-017433 A | 1/2000 | |
| JP | 2000-345327 A | 12/2000 | |
| JP | 2002-167668 A | 6/2002 | |
| JP | 2003-064473 A | 3/2003 | |
| JP | 2004-319410 | * 11/2004 | |
| JP | 2004-346392 | * 12/2004 | |
| JP | 2005-113174 A | 4/2005 | |

OTHER PUBLICATIONS

Machine Translation of Mori (JP 2004-319410) dated Nov. 2004.*
Machine Translation JP 2004-346392 dated Dec. 2004.*
Machine Translation of JP 2002-167668 dated Jun. 2002.*
ESP@Cenet Database, English Abstract of JP 2004-319410, Nov. 11, 2004.
ESP@Cenet Database, English Abstract of JP 2002-167668, Jun. 11, 2002.
ESP@Cenet Database, English Abstract of JP 2000-017433, Jan. 18, 2000.
ESP@Cenet Database, English Abstract of JP 2000-345327, Dec. 12, 2000.

* cited by examiner

Primary Examiner — Rodney McDonald
(74) Attorney, Agent, or Firm — Howson & Howson, LLP

(57) ABSTRACT

Provided is a ruthenium alloy sputtering target as a ruthenium alloy sintered compact target obtained by sintering mixed powder of ruthenium powder and metal powder capable of creating oxides easier than ruthenium, wherein purity of the target excluding gas components is 99.95 wt % or higher, said target contains 5 at % to 60 at % of metal capable of creating oxides easier than ruthenium, relative density is 99% or higher, and oxygen content as impurities is 1000 ppm or less. This ruthenium alloy sputtering target is capable of reducing its oxygen content, reducing the generation of arcing and particles during sputtering, increasing the target strength by improving the sintered density, and improving the deposition quality by strictly restricting the amount of B and P impurities in the target in order to prevent the compositional variability of B and P added in minute amounts to the Si semiconductor.

14 Claims, No Drawings

RUTHENIUM-ALLOY SPUTTERING TARGET

BACKGROUND OF THE INVENTION

The present invention relates to a ruthenium alloy sputtering target capable of reducing its oxygen content, reducing the generation of arcing and particles during sputtering, increasing the target strength by improving the sintered density, and improving the deposition quality by strictly restricting the amount of B and P impurities in the target in order to prevent the compositional variability of B and P added in minute amounts to the Si semiconductor.

Since a ruthenium (Ru) alloy has superior thermal stability in addition to having low resistivity and favorable barrier characteristics, it is attracting attention as a deposition material of a semiconductor device; in particular as a gate electrode material and various diffusion barrier materials.

When sintering a pure ruthenium target, dissociation of oxygen occurs near 1100° C., and, even when the oxygen content of the raw material powder is high at 2000 wtppm, it is possible to reduce the oxygen content to less than 100 wtppm with a sintered compact.

For example, Japanese Patent Laid-Open Publication No. H11-50163 (Patent Document 2) describes a high purity ruthenium target manufactured using raw material powder having an oxygen content of 500 ppm wherein the content of alkali metals is less than 1 ppm, content of alkali earth metals is less than 1 ppm, content of radioactive elements is less than 10 ppb, total content of carbon and gas components is less than 500 ppm, oxygen concentration is 100 ppm or less, and purity is 99.995% or higher.

Nevertheless, in the case of a ruthenium alloy, when elements other than ruthenium composing the alloy (hereinafter referred to as "alloy elements") create oxides easier than ruthenium and form oxides that are more stable than ruthenium, the oxygen that becomes dissociated from ruthenium will react with the alloy elements, and, as a result, the oxygen content of the ruthenium alloy cannot be reduced even after sintering. For example, this tendency is particularly strong with a ruthenium-tantalum alloy, and it is difficult to manufacture a target with a low oxygen content based on the powder sintering method.

For instance, although Patent Document 2 is an invention by the same applicant, even when using the raw material powder (ruthenium powder) described in such Patent Document 2, in the case of forming a ruthenium alloy, the oxygen content became 1000 to 2000 ppm when alloy elements forming stable oxides. Further, even when raw material powder (ruthenium powder) with a lower oxygen content was used, the resulting oxygen content was roughly the same level. This is considered to be because, even when the oxygen content of the raw material powder itself is low, adsorped oxygen exists in large quantities, and the raw material powder is easily oxidized through the mixing process.

As an example of a publicly known ruthenium alloy target, as described in Japanese Patent Laid-Open Publication No. 2004-319410 (Patent Document 1), a commercially available Ru powder that is less than 100 mesh is mixed with Ta powder, subject to hot press molding at a temperature of 1150° C. and a pressure of 15 MPa, and ground with a diamond grindstone at 200 rpm to create a target having a diameter of 125 mm$\phi$ and a thickness of 5 mm. Here, since there is no process to eliminate oxygen, the oxygen content is most likely high and the density is most likely low, and this cannot be used in the manufacture process of a semiconductor.

Further, Japanese Patent Laid-Open Publication No. 2002-167668 (Patent Document 3) describes sintering powder obtained by mixing commercially available ruthenium powder and an additive element through mechanical alloying using a ball mill or an attriter or sintering powder alloyed based on the plasma melting method through hot pressing, hot isostatic pressing or plasma sintering method. Here, it is described that to perform degassing in a vacuum or a hydrogen atmosphere at 600 to 900° C. during the hot pressing process is effective.

Nevertheless, since it is only described that degassing is effective to eliminate the adsorped oxygen or the like, oxygen of oxides previously formed from the alloy elements is not eliminated, and it is believed that it would be difficult to manufacture a target having an oxygen content of 1000 ppm or less even when alloy powder is prepared using the plasma melting method at the previous step.

This is because, with the plasma melting method, it is necessary to introduce a plasma formation gas (argon+ hydrogen, etc.) having a certain level of pressure into the reaction chamber in order to stably form superhot plasma, and it is considered that oxygen cannot be sufficiently eliminated since it is not possible to achieve a high vacuum. By subjecting the alloy powder obtained with the foregoing method to hot pressing and then HIP, although it is indeed possible to increase the density and suppress the concentration of B and P, the oxygen content will remain high.

As a ruthenium alloy, when alloy elements such as tantalum and niobium which form oxides easier than ruthenium are mixed on a macroscale, deoxidization will become difficult, and this is notable when the composition of alloy elements is 5 at % or greater, and particularly when the composition is 10 at % to 60 at %.

Meanwhile, when a ruthenium alloy is to be used as a deposition material of a semiconductor device, in particular as a gate electrode material and various diffusion barrier materials, composition in the foregoing range will be required. In conventional technology, the oxygen content being high in excess of 1000 ppm was inevitable. Thus, when sputtering is performed using such a target, there is a problem in that the quality of the deposition will decrease because the target strength will be weak as a result of the sintered density being low, and the generation of arcing and particles will become notable during sputtering, and it was not possible to obtain a target material having the characteristics required for a semiconductor device.

SUMMARY OF THE INVENTION

In view of the foregoing points, an object of the present invention is to provide a ruthenium alloy sputtering target capable of reducing its oxygen content, reducing the generation of arcing and particles during sputtering, increasing the target strength by improving the sintered density, and improving the deposition quality by strictly restricting the amount of B and P impurities in the target in order to prevent the compositional variability of B and P added in minute amounts to the Si semiconductor.

In order to achieve the foregoing object, the present inventors discovered that a ruthenium sputtering target superior in deposition characteristics in comparison to conventional targets could be obtained by strictly restricting the oxygen content contained in the target, restricting the amount of B and P impurities, improving and devising the target structure, regulating the crystal grain size, and improving the density.

Based on the foregoing discovery, the present invention provides:
1) A ruthenium alloy sputtering target as a ruthenium alloy sintered compact target obtained by sintering mixed powder of ruthenium powder and metal powder capable of creating oxides easier than ruthenium, wherein purity of the target excluding gas components is 99.95 wt % or higher, the target contains 5 at % to 60 at % of metal capable of creating oxides easier than ruthenium, relative density is 99% or higher, and oxygen content as impurities is 1000 ppm or less;
2) The ruthenium alloy sputtering target according to paragraph 1) above, wherein the oxygen content is 100 to 500 wtppm;
3) The ruthenium alloy sputtering target according to paragraph 1) or paragraph 2) above, wherein the metal capable of creating oxides easier than ruthenium is tantalum; and
4) The ruthenium alloy sputtering target according to paragraph 1) or paragraph 2) above, wherein the metal capable of creating oxides easier than ruthenium is niobium.

The present invention further provides:
5) The ruthenium alloy sputtering target according to any one of paragraphs 1) to 4) above, wherein B and P are respectively less than 1 ppm;
6) The ruthenium alloy sputtering target according to any one of paragraphs 1) to 5) above, wherein no oxygen enriching section can be found at an interface of ruthenium and the metal capable of creating oxides easier than ruthenium in the target structure, and the target has a structure in which the metals are not alloyed; and
7) The ruthenium alloy sputtering target according to any one of paragraphs 1) to 6) above, wherein the average crystal grain size of the unalloyed structure among ruthenium and the metal capable of creating oxides easier than ruthenium is 5 to 50 µm.

The present invention yields a superior effect in being able to obtain a ruthenium alloy sputtering target capable of reducing its oxygen content, reducing the generation of arcing and particles during sputtering, increasing the target strength by improving the sintered density, and improving the deposition quality by strictly restricting the amount of B and P impurities in the target in order to prevent the compositional variability of B and P added in minute amounts to the Si semiconductor.

DETAILED DESCRIPTION OF THE INVENTION

The ruthenium alloy sputtering target of the present invention is a ruthenium alloy sintered compact target obtained by sintering mixed powder of ruthenium powder and metal powder capable of creating oxides easier than ruthenium, and achieves a target purity of 99.95 wt % or higher (provided that this excludes gas components), and, although metals capable of creating oxides easier than ruthenium are contained in the amount of 5 at % to 60 at %, the relative density is 99% or higher, and the oxygen content as impurities is 1000 ppm or less.

More preferably, the oxygen content in the ruthenium alloy sputtering target is 100 to 500 wtppm. As the alloy elements capable of creating oxides easier than ruthenium of the ruthenium alloy, typically, there are tantalum, niobium, titanium, hafnium, and zirconium. Thus, a ruthenium-tantalum alloy, a ruthenium-niobium alloy, a ruthenium-titanium alloy, a ruthenium-hafnium alloy, and a ruthenium-zirconium alloy are effective as a deposition material of a semiconductor device, in particular a gate electrode material and various diffusion barrier materials. Nevertheless, it should be known that materials other than these alloys may also be used, and are also covered by the present invention.

Further, with the ruthenium alloy sputtering target of the present invention, it is desirable that B and P are respectively less than 1 ppm. Originally, B or P is added as a doping material to the semiconductor device, and, when being used as a gate electrode material or various diffusion barrier materials, it is necessary to avoid a situation where B or P is transferred from the material to the semiconductor device, cause compositional variability, and become a new contamination source. Accordingly, it is desirable to keep the content of B and P in the target respectively less than 1 ppm.

In the ruthenium alloy sputtering target structure, it is desirable that the target has a structure in which oxygen enrichment is decreased or completely eliminated at any part of an interface of ruthenium and the metal capable of forming oxides more easily than ruthenium and a structure in which ruthenium and the metal are not completely alloyed. Thereby, it is possible to seek the uniformity of the film composition, and disperse oxygen as much as possible so as to minimize the influence of oxygen.

It is desirable for the structure, in which ruthenium and the metal capable of forming oxides more easily than ruthenium are not completely alloyed, to be adjusted to have an average crystal grain size of 5 to 50 µm, wherein to be not completely alloyed includes to make no intermetallic compound.

When this average crystal grain size is coarsened to exceed 50 µm or fined excessively, a phenomenon of the density of the sintered compact not improving will occur in both cases. Therefore, the foregoing average crystal grain size is set to be 5 to 50 µm. Accordingly, it will be possible to reduce compositional segregation and form a uniform thin film.

Generally speaking, since the grain size of the sintering powder will be reflected in the structure after sintering, it is necessary to adjust the grain size at the stage of the raw material powder. When the powder is refined excessively into fine powder, since it will be difficult to realize a low oxygen content by absorbing oxygen, from this perspective as well, it could be said that it is desirable to avoid used excessively fine powder.

As a specific manufacturing method, for instance, commercially available 3N grade (99.9% purity) ruthenium powder (low oxygen product) is introduced into an ultrahigh vacuum chamber, and the ruthenium powder is heated with high-power infrared lamp heating or microwave heating to eliminate oxygen. The powder temperature is roughly 1100 to 1300° C. This is because if the powder temperature is not greater than 1100° C., oxygen dissociation will not occur sufficiently.

Further, this heating will make the ruthenium powders bond with each other and prevent the sintering characteristics from deteriorating. The reason lamp heating or microwave heating is used is in order to cool the powder to room temperature quickly.

After confirming that oxygen has been sufficiently discharged with the oxygen monitor connected to the chamber, heating is stopped and rapid cooling is performed.

Subsequently, argon gas is introduced, the foregoing ruthenium powder is encapsulated into a container, and further mixed with 4N grade (99.99 wt % purity) tantalum powder. This tantalum powder is obtained by subjecting a tantalum EB ingot to hydrogenation and dehydrogenation, and pulverization.

This mixed powder is subject to deoxygenation treatment at 1100° C. once again, hot pressing at a temperature of 1500 to 1800° C. in a vacuum, and hot isostatic press treatment in order to prepare a sintered compact. This is further subject to finishing processing (machining, etc.) to form a target shape.

The ruthenium alloy sputtering target obtained thereby had a target purity excluding gas components of 99.95 wt % or higher, contained metals capable of creating oxides easier than ruthenium in an amount of 5 at % to 60 at %, and had a relative density or 99% or higher (provided that this excluded gas components). Thereby, the adverse effect of oxygen can be avoided, and, even though the target contains metals capable of creating oxides easier than ruthenium in an amount of 5 at % to 60 at %, it is possible to attain a relative density of 99% or higher, and an oxygen content as impurities in an amount of 1000 ppm or less.

EXAMPLES

Examples of the present invention are now explained. These Examples merely illustrate a preferred example, and the present invention shall in no way be limited thereby. In other words, all modifications, other embodiments and modes covered by the technical spirit of the present invention shall be included in this invention.

Examples 1 to 6

Commercially available 3N grade ruthenium powder (low oxygen product) was introduced into an ultrahigh vacuum chamber, and the ruthenium powder was heated with a high-power infrared lamp to eliminate oxygen. The oxygen concentration of the raw material Ru powder was 520 ppm, and the grain size was 1.5 µm. The powder temperature was roughly 1200° C. After confirming that sufficient oxygen was discharged using an oxygen monitor connected to the chamber, the heating was stopped, and rapid cooling was performed to cool the powder temperature to room temperature.

Subsequently, the obtained powder was placed in a container, argon gas was introduced therein, an EB (electron beam) dissolved tantalum ingot was repeatedly subject to hydrogenation and dehydrogenation, and the pulverized 4N grade tantalum powder was mixed with ruthenium powder by changing the additive amount to 5 at %, 10 at %, 20 at %, 30 at %, 40 at %, and 60 at %. The oxygen concentration of the tantalum raw material was 790 ppm, and the grain size was 21 µm.

The mixed powder of ruthenium and tantalum was subject to deacidification treatment once again at 1100° C., hot pressed at 1600° C. in a vacuum, and hot isostatic press treatment to prepare a sintered compact.

The results are shown in Table 1. As shown in Table 1, the tantalum additive amount was changed to 5 at %, 10 at %, 20 at %, 30 at %, 40 at %, and 60 at %. As a result, the density of the sintered compact was in the range of 99 to 99.3%, and all results exceeded 99%.

Further, the oxygen concentration was within the range of 110 to 270 wtppm, and a low oxygen content was realized. The average crystal grain size of the unalloyed structure of ruthenium and metal capable of creating oxides easier than ruthenium was in the range of 24 to 60 µm, the B concentration was less than 0.2 wtppm, and the P concentration was also less than 0.3 wtppm.

As described above, Examples 1 to 6 all had a target purity of 99.95 wt % or higher (provided that this excludes gas components), and, although they contained tantalum as the metal capable of creating oxides easier than ruthenium in an amount of 5 at % to 60 at %, they were all favorable ruthenium alloy targets that achieved a relative density of 99% or higher, and an oxygen content as impurities of 1000 ppm or less.

Further, the structure of Examples 1 to 6 was observed with XRD and EPMA, and Examples 1 to 6 all had a structure that was not completely alloyed and an oxygen enriching section could not be seen at any of the interfaces.

Accordingly, since it was possible to reduce the generation of arcing and particles during sputtering, improve the sintered density and increase the target strength, and strictly restrict the amount of B and P impurities in the target, it was possible to improve the deposition quality.

Examples 7 to 12

In Examples 7 to 12, commercially available 3N grade ruthenium powder (medium oxygen product) was used. This commercially available 3N grade ruthenium powder (medium oxygen product) was introduced into an ultrahigh vacuum chamber, and the ruthenium powder was heated with a high-power infrared lamp to eliminate oxygen. The oxygen concentration of the raw material Ru powder was 2100 ppm, and the grain size was 0.7 µm. The powder temperature was roughly 1200° C. After confirming that sufficient oxygen was discharged using an oxygen monitor connected to the chamber, the heating was stopped, and rapid cooling was performed to cool the powder temperature to room temperature.

Subsequently, the obtained powder was placed in a container, argon gas was introduced therein, an EB (electron beam) dissolved tantalum ingot was repeatedly subject to hydrogenation and dehydrogenation, and the pulverized 4N grade tantalum powder was mixed with ruthenium powder by changing the additive amount. The oxygen concentration of the tantalum raw material was 790 ppm, and the grain size was 21 µm.

As with Examples 1 to 6, the mixed powder of ruthenium and tantalum was subject to deacidification treatment once again at 1100° C., hot pressed at 1600° C. in a vacuum, and hot isostatic press treatment to prepare a sintered compact. The results are shown in Table 1.

As shown in Table 1, the tantalum additive amount was changed to 5 at %, 10 at %, 20 at %, 30 at %, 40 at %, and 60 at %. As a result, the density of the sintered compact was in the range of 99.3 to 100%, all results exceeded 99%, and the density was more superior than Examples 1 to 6.

Further, the oxygen concentration was within the range of 290 to 550 wtppm, and, although this increased in comparison to Examples 1 to 6, a low oxygen content was sufficiently realized. The average crystal grain size of the unalloyed structure of ruthenium and metal capable of creating oxides easier than ruthenium was in the range of 13 to 17 µm and more refined than Examples 1 to 6. Further, the B concentration was less than 0.2 wtppm, and the P concentration was also less than 0.3 wtppm.

As described above, Examples 7 to 12 all had a target purity of 99.95 wt % or higher (provided that this excludes gas components), and, although they contained tantalum as the metal capable of creating oxides easier than ruthenium in an amount of 5 at % to 60 at %, they were all favorable ruthenium alloy targets that achieved a relative density of 99% or higher, and an oxygen content as impurities of 1000 ppm or less. Further, the structure of Examples 7 to 12 was observed with XRD and EPMA, and Examples 7 to 12 all had a structure that was not completely alloyed and an oxygen enriching section could not be seen at any of the interfaces.

Accordingly, since it was possible to reduce the generation of arcing and particles during sputtering, improve the sintered density and increase the target strength, and strictly restrict the amount of B and P impurities in the target, it was possible to improve the deposition quality.

Examples 13 to 18

In Examples 13 to 18, commercially available 3N grade ruthenium powder (high oxygen product) was used. This commercially available 3N grade ruthenium powder (high oxygen product) was introduced into an ultrahigh vacuum chamber, and the ruthenium powder was heated with a high-power infrared lamp to eliminate oxygen. The oxygen concentration of the raw material Ru powder was 3000 ppm, and the grain size was 0.3 µm. The powder temperature was roughly 1200° C. After confirming that sufficient oxygen was discharged using an oxygen monitor connected to the chamber, the heating was stopped, and rapid cooling was performed to cool the powder temperature to room temperature.

Subsequently, the obtained powder was placed in a container, argon gas was introduced therein, an EB (electron beam) dissolved tantalum ingot was repeatedly subject to hydrogenation and dehydrogenation, and the pulverized 4N grade tantalum powder was mixed with ruthenium powder by changing the additive amount. The oxygen concentration of the tantalum raw material was 790 ppm, and the grain size was 21 µm.

As with Examples 1 to 6, the mixed powder of ruthenium and tantalum was subject to deacidification treatment once again at 1100° C., hot pressed at 1600° C. in a vacuum, and hot isostatic press treatment to prepare a sintered compact. The results are shown in Table 1.

As shown in Table 1, the tantalum additive amount was changed to 5 at %, 10 at %, 20 at %, 30 at %, 40 at %, and 60 at %. As a result, the density of the sintered compact was in the range of 99.2 to 99.4%, all results exceeded 99%, and the density was slightly superior than Examples 1 to 6.

Further, the oxygen concentration was within the range of 410 to 860 wtppm, and, although this increased in comparison to Examples 1 to 6, a low oxygen content was sufficiently realized. The average crystal grain size of the unalloyed structure of ruthenium and metal capable of creating oxides easier than ruthenium was in the range of 6 to 11 µm and more refined than Examples 1 to 6. Further, the B concentration was less than 0.2 wtppm, and the P concentration was also less than 0.3 wtppm.

As described above, Examples 13 to 18 all had a target purity of 99.95 wt % or higher (provided that this excludes gas components), and, although they contained tantalum as the metal capable of creating oxides easier than ruthenium in an amount of 5 at % to 60 at %, they were all favorable ruthenium alloy targets that achieved a relative density of 99% or higher, and an oxygen content as impurities of 1000 ppm or less. Further, the structure of Examples 13 to 18 was observed with XRD and EPMA, and Examples 13 to 18 all had a structure that was not completely alloyed and an oxygen enriching section could not be seen at any of the interfaces.

Accordingly, since it was possible to reduce the generation of arcing and particles during sputtering, improve the sintered density and increase the target strength, and strictly restrict the amount of B and P impurities in the target, it was possible to improve the deposition quality.

TABLE 1

| | Raw Material Ru Powder Oxygen (ppm) | Ru Powder Grain Size (µm) | Composition (Ta added amount) | Sintering Conditions | Sintered Compact Density (%) | Oxygen (ppm) | Grain Size (µm) | B (ppm) | P (ppm) |
|---|---|---|---|---|---|---|---|---|---|
| Example 1 | 520 | 1.5 | 5 at % | Deoxidation Process + Standard Sintering | 99 | 110 | 27 | <0.2 | <0.3 |
| Example 2 | 520 | 1.5 | 10 at % | Deoxidation Process + Standard Sintering | 99.1 | 120 | 30 | <0.2 | <0.3 |
| Example 3 | 520 | 1.5 | 20 at % | Deoxidation Process + Standard Sintering | 99.2 | 150 | 26 | <0.2 | <0.3 |
| Example 4 | 520 | 1.5 | 30 at % | Deoxidation Process + Standard Sintering | 99.1 | 220 | 24 | <0.2 | <0.3 |
| Example 5 | 520 | 1.5 | 40 at % | Deoxidation Process + Standard Sintering | 99.2 | 180 | 60 | <0.2 | <0.3 |
| Example 6 | 520 | 1.5 | 60 at % | Deoxidation Process + Standard Sintering | 99.3 | 270 | 40 | <0.2 | <0.3 |
| Example 7 | 2100 | 0.7 | 5 at % | Deoxidation Process + Standard Sintering | 99.6 | 290 | 15 | <0.2 | <0.3 |
| Example 8 | 2100 | 0.7 | 10 at % | Deoxidation Process + Standard Sintering | 99.6 | 320 | 16 | <0.2 | <0.3 |
| Example 9 | 2100 | 0.7 | 20 at % | Deoxidation Process + Standard Sintering | 99.7 | 380 | 15 | <0.2 | <0.3 |
| Example 10 | 2100 | 0.7 | 30 at % | Deoxidation Process + Standard Sintering | 99.9 | 360 | 17 | <0.2 | <0.3 |
| Example 11 | 2100 | 0.7 | 40 at % | Deoxidation Process + Standard Sintering | 100 | 550 | 13 | <0.2 | <0.3 |
| Example 12 | 2100 | 0.7 | 60 at % | Deoxidation Process + Standard Sintering | 99.3 | 420 | 15 | <0.2 | <0.3 |
| Example 13 | 3000 | 0.3 | 5 at % | Deoxidation Process + Standard Sintering | 99.3 | 410 | 7 | <0.2 | <0.3 |
| Example 14 | 3000 | 0.3 | 10 at % | Deoxidation Process + Standard Sintering | 99.3 | 450 | 7 | <0.2 | <0.3 |

TABLE 1-continued

| | Raw Material Ru Powder Oxygen (ppm) | Ru Powder Grain Size (μm) | Composition (Ta added amount) | Sintering Conditions | Sintered Compact Density (%) | Oxygen (ppm) | Grain Size (μm) | B (ppm) | P (ppm) |
|---|---|---|---|---|---|---|---|---|---|
| Example 15 | 3000 | 0.3 | 20 at % | Deoxidation Process + Standard Sintering | 99.4 | 530 | 6 | <0.2 | <0.3 |
| Example 16 | 3000 | 0.3 | 30 at % | Deoxidation Process + Standard Sintering | 99.4 | 860 | 6 | <0.2 | <0.3 |
| Example 17 | 3000 | 0.3 | 40 at % | Deoxidation Process + Standard Sintering | 99.2 | 620 | 10 | <0.2 | <0.3 |
| Example 18 | 3000 | 0.3 | 60 at % | Deoxidation Process + Standard Sintering | 99.4 | 780 | 11 | <0.2 | <0.3 |

Comparative Examples 1 to 3

Comparative Examples 1 to 3 show a case of pure ruthenium that is not the ruthenium alloy target of the present invention, and, although it is outside the scope of the target component, it is hereby listed for reference.

In this case, commercially available 3N grade ruthenium powders (low oxygen product: oxygen content 520 wtppm; medium oxygen product: oxygen content 2100 wtppm; high oxygen product: oxygen content 3000 wtppm) were respectively hot pressed at 1600° C. in a vacuum, and hot isostatic press treatment to prepare a sintered compact. The results are shown in Table 2.

As evident from these examples, oxygen significantly decreased (60 to 110 wtppm) based on the normal sintering method with ruthenium alone even if the oxygen content of the raw material powder is large. Nevertheless, this case possesses a problem in that the content of B and P exceeds 1 wtppm.

Comparative Examples 4 to 8

In Comparative Examples 4 to 8, commercially available 3N grade ruthenium powder (medium oxygen product: oxygen content 2100 wtppm) was used, and this ruthenium powder (medium oxygen product) was mixed with 4N grade tantalum powder by changing the additive amount of tantalum. The oxygen concentration of the tantalum raw material powder was 790 ppm, and the grain size was 21 μm. The additive amounts were respectively 0.5 at %, sat %, 70 at %, 80 at %, and 90 at %, and these amounts were either less than or in excess of the tantalum content of the present invention.

The mixed powder of ruthenium and tantalum was hot pressed at 1600° C. in a vacuum, and hot isostatic press treatment to prepare a sintered compact. The results are shown in Table 2.

As shown in Table 2, Comparative Example 4 and Comparative Example 5 are cases where the additive amount is less than the tantalum content of the present invention, and the oxygen concentration was low and the crystal grain size was small, but the B concentration and the P concentration exceeded 1 wtppm, and the density of the sintered compact was 96%, and resulted in insufficient density.

Meanwhile, Comparative Examples 6 to 8 are cases where the additive amounts of tantalum were 70 at %, 80 at %, and 90 at %, and the oxygen content in the target increased pursuant to the additive amount, and exceeded 1000 wtppm. Although the average crystal grain size of the unalloyed structure of ruthenium and metal capable of creating oxides easier than ruthenium was small, the B concentration and the P concentration exceeded 1 wtppm, the density of the sintered compact was less than 99%, and resulted in insufficient density.

Accordingly, the generation of arcing and particles increased during sputtering, the sintered density was low and the target strength decreased, the amount of B and P impurities in the target increased, and the deposition quality deteriorated.

Comparative Examples 9 to 14

In Comparative Examples 9 to 14, commercially available 3N grade ruthenium powder (low oxygen product: oxygen content 520 wtppm) was used, and this ruthenium powder (low oxygen product) was mixed with 4N grade tantalum powder by changing the additive amount of tantalum to 5 at %, 10 at %, 20 at %, 30 at %, 40 at %, and 60 at %. The oxygen concentration of the tantalum raw material powder was 790 ppm, and the grain size was 21 μm. The mixed powder of ruthenium and tantalum was hot pressed at 1600° C. in a vacuum, and hot isostatic press treatment to prepare a sintered compact. The results are shown in Table 2.

As shown in Table 2, although the average crystal grain size of the unalloyed structure of ruthenium and metal capable of creating oxides easier than ruthenium was small, the oxygen concentration all exceeded 1000 wtppm, the B concentration and the P concentration exceeded 1 wtppm, the density of the sintered compact was less than 99%, and resulted in insufficient density.

Accordingly, the generation of arcing and particles increased during sputtering, the sintered density was low and the target strength decreased, the amount of B and P impurities in the target increased, and the deposition quality deteriorated.

Comparative Examples 15 to 20

In Comparative Examples 15 to 20, commercially available 3N grade ruthenium powder (medium oxygen product: oxygen content 2100 wtppm) was used, and this ruthenium powder (medium oxygen product) was mixed with 4N grade tantalum powder by changing the additive amount of tantalum. The oxygen concentration of the tantalum raw material powder was 790 ppm, and the grain size was 21 μm. The additive amounts were respectively 5 at %, 10 at %, 20 at %, 30 at %, 40 at %, 60 at %.

The mixed powder of ruthenium and tantalum was hot pressed at 1600° C. in a vacuum, and hot isostatic press treatment to prepare a sintered compact. The results are shown in Table 2.

As shown in Table 2, although the average crystal grain size of the unalloyed structure of ruthenium and metal capable of creating oxides easier than ruthenium was small, the oxygen concentration increased abnormally to 2200 to 3300 wtppm, the B concentration and the P concentration exceeded 1 wtppm, the density of the sintered compact was less than 99%, and resulted in insufficient density.

Accordingly, in comparison to Comparative Examples 9 to 14, the generation of arcing and particles increased even more during sputtering, the sintered density was low and the target strength decreased, the amount of B and P impurities in the target increased, and the deposition quality deteriorated.

Comparative Examples 21 to 26

In Comparative Examples 21 to 26, commercially available 3N grade ruthenium powder (medium oxygen product: oxygen content 2100 wtppm) was used, and this ruthenium powder (medium oxygen product) was mixed with 4N grade tantalum powder by changing the additive amount of tantalum. The oxygen concentration of the tantalum raw material powder was 790 ppm, and the grain size was 21 μm. The additive amounts were respectively 5 at %, 10 at %, 20 at %, 30 at %, 40 at %, 60 at %.

The mixed powder of ruthenium and tantalum was prepared as alloy powder with the plasma melting method, hot pressed at 1600° C. in a vacuum, and hot isostatic press treatment to prepare a sintered compact. The results are shown in Table 2.

As shown in Table 2, although the B concentration and the P concentration were less than 1 wtppm, and the oxygen concentration improved in comparison to Comparative Examples 15 to 20, it was still in the range of 1300 to 1900 wtppm, and the oxygen content was extremely high. Further, the density of the sintered compact improved in certain cases (Comparative Example 26) somewhat since the oxygen content was extremely high, most cases were less than 99%, and resulted in insufficient density. Accordingly, the generation of arcing and particles increased during sputtering, the sintered density was low and the target strength decreased, the amount of B and P impurities in the target increased, and the deposition quality deteriorated.

The structure of the Comparative Examples was observed with XRD and EPMA. As described above, in all of the Examples, an oxygen enriching section could not be observed at any of the interfaces, and a tantalum that did not completely react was observed. With Comparative Examples 6 to 20, an oxygen enriching section was observed at the interface, and Comparative Examples 21 to 26 all became structures that were completely alloyed or became intermetallic compounds.

TABLE 2

| | Raw Material Ru Powder Oxygen (ppm) | Ru Powder Grain Size (μm) | Composition (Ta content) | Sintering Conditions | Sintered Compact Density (%) | Oxygen (ppm) | Grain Size (μm) | B (ppm) | P (ppm) |
|---|---|---|---|---|---|---|---|---|---|
| Comparative Example 1 | 520 | 1.5 | — | Standard Sintering | 95.8 | 60 | 6 | 5 | 3 |
| Comparative Example 2 | 2100 | 0.7 | — | Standard Sintering | 98.6 | 85 | 3 | 5 | 2 |
| Comparative Example 3 | 3000 | 0.3 | — | Standard Sintering | 99.5 | 110 | <1 | 10 | 2 |
| Comparative Example 4 | 2100 | 0.7 | 0.5 at % | Standard Sintering | 96 | 120 | 8 | 10 | 2 |
| Comparative Example 5 | 2100 | 0.7 | 3 at % | Standard Sintering | 96 | 310 | 9 | 15 | 1 |
| Comparative Example 6 | 2100 | 0.7 | 70 at % | Standard Sintering | 97.1 | 1300 | 16 | 5 | 3 |
| Comparative Example 7 | 2100 | 0.7 | 80 at % | Standard Sintering | 98.3 | 1200 | 15 | 5 | 3 |
| Comparative Example 8 | 2100 | 0.7 | 90 at % | Standard Sintering | 95.6 | 1100 | 13 | 10 | 3 |
| Comparative Example 9 | 520 | 1.5 | 5 at % | Standard Sintering | 95 | 1100 | 5 | 15 | 3 |
| Comparative Example 10 | 520 | 1.5 | 10 at % | Standard Sintering | 96.5 | 1200 | 5 | 15 | 3 |
| Comparative Example 11 | 520 | 1.5 | 20 at % | Standard Sintering | 97.5 | 1900 | 1.5 | 5 | 2 |
| Comparative Example 12 | 520 | 1.5 | 30 at % | Standard Sintering | 95.5 | 1700 | 2.3 | 5 | 2 |
| Comparative Example 13 | 520 | 1.5 | 40 at % | Standard Sintering | 95.6 | 2000 | 4 | 5 | 1 |
| Comparative Example 14 | 520 | 1.5 | 60 at % | Standard Sintering | 97 | 1300 | 3 | 5 | 1 |
| Comparative Example 15 | 2100 | 0.7 | 5 at % | Standard Sintering | 95 | 2500 | 5 | 5 | 1 |
| Comparative Example 16 | 2100 | 0.7 | 10 at % | Standard Sintering | 96.5 | 3000 | 5 | 5 | 1 |
| Comparative Example 17 | 2100 | 0.7 | 20 at % | Standard Sintering | 97.5 | 3300 | 1.5 | 5 | 1 |
| Comparative Example 18 | 2100 | 0.7 | 30 at % | Standard Sintering | 95.5 | 3900 | 2.3 | 5 | 2 |
| Comparative Example 19 | 2100 | 0.7 | 40 at % | Standard Sintering | 95.6 | 3500 | 4 | 5 | 2 |
| Comparative Example 20 | 2100 | 0.7 | 60 at % | Standard Sintering | 97 | 2200 | 3 | 5 | 2 |
| Comparative Example 21 | 2100 | 0.7 | 5 at % | Alloying by Plasma Fusion + Standard Sintering | 93.2 | 1300 | 3 | <0.2 | <0.3 |
| Comparative Example 22 | 2100 | 0.7 | 10 at % | Alloying by Plasma Fusion + Standard Sintering | 93.1 | 1300 | 4 | <0.2 | <0.3 |
| Comparative Example 23 | 2100 | 0.7 | 20 at % | Alloying by Plasma Fusion + Standard Sintering | 93.5 | 1500 | 3 | <0.2 | <0.3 |
| Comparative Example 24 | 2100 | 0.7 | 30 at % | Alloying by Plasma Fusion + Standard Sintering | 95.3 | 1900 | 11 | <0.2 | <0.3 |
| Comparative Example 25 | 2100 | 0.7 | 40 at % | Alloying by Plasma Fusion + Standard Sintering | 97.1 | 1700 | 7 | <0.2 | <0.3 |
| Comparative Example 26 | 2100 | 0.7 | 60 at % | Alloying by Plasma Fusion + Standard Sintering | 99.8 | 1800 | 9 | <0.2 | <0.3 |

The present invention yields a superior effect in being able to obtain a ruthenium alloy sputtering target capable of reducing its oxygen content, reducing the generation of arcing and particles during sputtering, increasing the target strength by improving the sintered density, and improving the deposition quality by strictly restricting the amount of B and P impurities in the target in order to prevent the compositional variability of B and P added in minute amounts to the Si semiconductor. Accordingly, the present invention is useful as a ruthenium alloy sputtering target for a deposition material of a semiconductor device; in particular, for a gate electrode material and various diffusion barrier materials.

The invention claimed is:

1. A ruthenium alloy sputtering target comprising a sintered compact obtained by sintering a mixed powder consisting of a powder of ruthenium and a powder of a metal capable of forming oxides thereof more easily than ruthenium, wherein said metal is tantalum, niobium, titanium, hafnium or zirconium, wherein said target has a purity excluding gas components of 99.95 wt % or higher, wherein said target contains said metal in an amount of 5 at % to 60 at %, has a relative density of 99% or higher, and has an oxygen content as an impurity of 1000 ppm or less, and wherein said target has a structure in which ruthenium and said metal are not completely alloyed, the structure having an average crystal grain size of 5 to 50 µm.

2. The ruthenium alloy sputtering target according to claim 1, wherein the oxygen content is 100 to 500 wtppm.

3. The ruthenium alloy sputtering target according to claim 2, wherein said metal is tantalum.

4. The ruthenium alloy sputtering target according to claim 2, wherein said metal is niobium, titanium, hafnium or zirconium.

5. The ruthenium alloy sputtering target according to claim 4, wherein said target contains B and P as impurities each in an amount of less than 1 wtppm.

6. The ruthenium alloy sputtering target according to claim 4, wherein the structure has no oxygen enrichment revealed on the basis of XRD and EPMA at any part of an interface of ruthenium and said metal.

7. The ruthenium alloy sputtering target according to claim 3, wherein said target contains B and P as impurities each in an amount of less than 1 wtppm.

8. The ruthenium alloy sputtering target according to claim 2, wherein said target contains B and P as impurities each in an amount of less than 1 wtppm.

9. The ruthenium alloy sputtering target according to claim 2, wherein said target has a structure that has no oxygen enrichment revealed on the basis of XRD and EPMA at any part of an interface of ruthenium and said metal.

10. The ruthenium alloy sputtering target according to claim 1, wherein said target contains B and P as impurities each in an amount of less than 1 wtppm.

11. The ruthenium alloy sputtering target according to claim 1, wherein said target has a structure that has no oxygen enrichment revealed on the basis of XRD and EPMA at any part of an interface of ruthenium and said metal.

12. A ruthenium alloy sputtering target according to claim 10, wherein the target consists of ruthenium, 20 at % to 60 at % of the metal selected from the group consisting of tantalum, niobium, titanium, hafnium and zirconium, and impurities.

13. The ruthenium alloy sputtering target according to claim 1, wherein said sintered compact contains 10 to 60 at % of said metal.

14. The ruthenium alloy sputtering target according to claim 1, wherein said sintered compact contains 20 to 60 at % of said metal.

* * * * *